United States Patent [19]
Ng et al.

[11] Patent Number: 5,563,573
[45] Date of Patent: Oct. 8, 1996

[54] PSEUDO-RANDOM SWITCHED RESISTOR

[75] Inventors: Vincent Ng, Alhambra; Frank Bohac, Laguna Hills; Joyce Taylor, Laguna Niguel, all of Calif.

[73] Assignee: Hughes Aircraft Company, Los Angeles, Calif.

[21] Appl. No.: 329,552

[22] Filed: Oct. 26, 1994

[51] Int. Cl.$^6$ .................................................. H01C 13/00
[52] U.S. Cl. ......................................... 338/334; 338/215
[58] Field of Search .................................... 338/334, 215; 307/11; 377/55, 44

[56] References Cited

U.S. PATENT DOCUMENTS

| | | | |
|---|---|---|---|
| 4,085,334 | 4/1978 | Shinohara et al. | 307/11 |
| 5,045,832 | 9/1991 | Tam | 338/34 |
| 5,065,132 | 11/1991 | Taddiker et al. | 338/34 |
| 5,208,842 | 5/1993 | Atwood et al. | 377/55 |
| 5,248,956 | 9/1993 | Himes et al. | 338/34 |

*Primary Examiner*—Marvin M. Lateef
*Attorney, Agent, or Firm*—M. E. Lachman; M. W. Sales; W. K. Denson-Low

[57] ABSTRACT

A pseudo-random switched resistor for emulating a relatively high input impedance. The switched resistor comprises a relatively low value resistor, a semiconductor switch coupled to the resistor, and a pseudo-random pulse generator coupled to the switch for controlling the on time of the switch to emulate the relatively high input impedance. The random pulse generator comprises a plurality of cascaded circuits that are coupled to a flip flop. The plurality of cascaded circuits each comprise a shift register for receiving clock signals and for generating a sequence of $(2^N-1)$ pseudo-random numbers and a terminal count pulse at the end of every sequence, an N-bit binary counter for receiving the terminal count pulse which clocks it, and an equivalence circuit for comparing the outputs of the shift register and the binary counter and for generating an output signal when there is a match. The flip-flop generates a pulse to close the switch whenever there is a match between the output of the shift register and the binary counter as determined by the equivalence circuit.

8 Claims, 3 Drawing Sheets

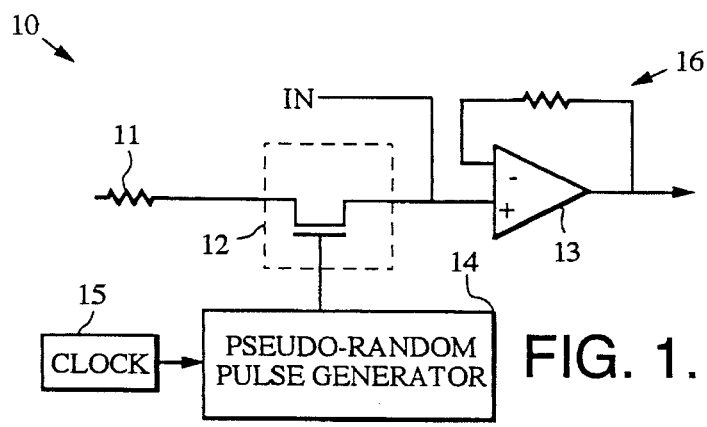
FIG. 1.
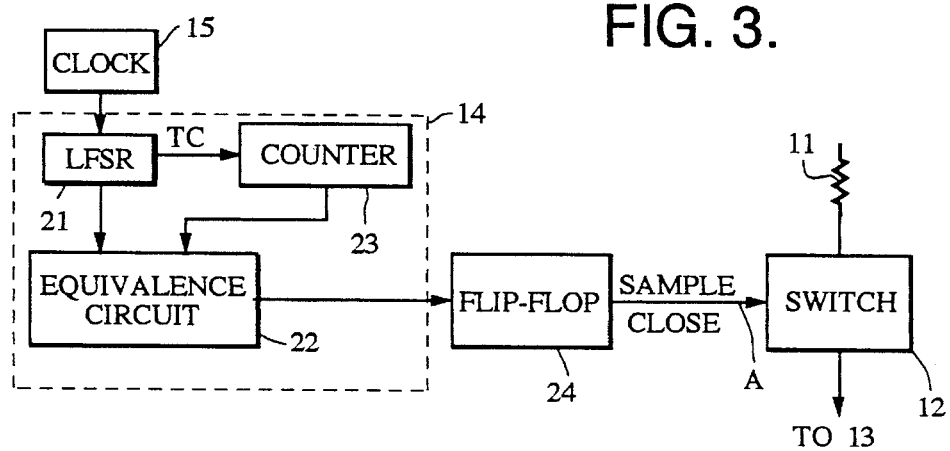
FIG. 3.
FIG. 2.
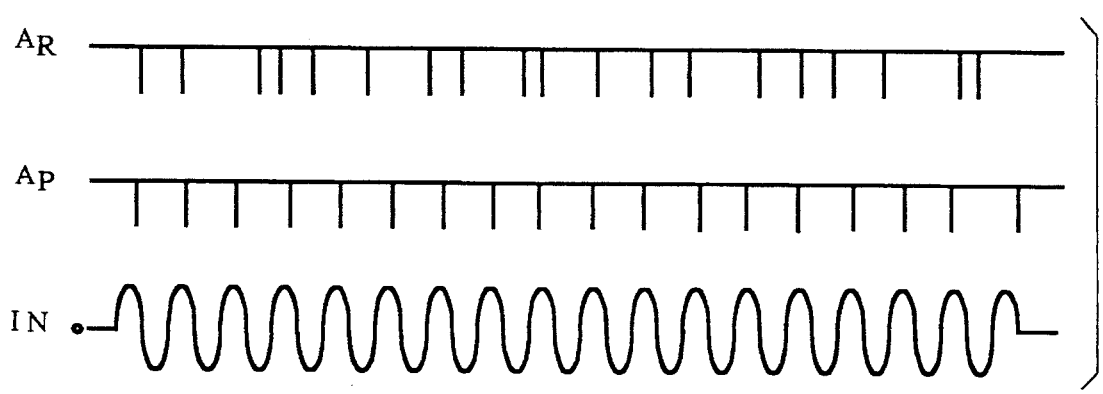

PSEUDO-RANDOM SWITCHED RESISTOR

BACKGROUND

The present invention relates generally to switched resistors that are used to emulate a resistance in an integrated circuit, and more particularly, to a pseudo-random switched resistor that produces a very high resistance.

Switched resistors have been conventionally used to provide high input impedance values for amplifiers used in integrated circuits. The resistor is a plate of conductive material that also has a capacitance associated with it. Therefore, resistance and capacitance are linearly related. What is desired is to have a high value resistor with a low capacitance value. This has not been achieved in the past. Conventional large value resistors have large capacitance values which pass less signal to the amplifier. Furthermore large resistors typically take up a large amount of chip area and this is not desirable.

Therefore, what has conventionally been done is to use a switched resistor, which is a low value (2 megohm) resistor that is switched into and out of the circuit. The resistor is switched at a low duty rate (1/512, for example), and the effective resistance of the switched resistor is the actual resistance value divided by the duty rate, which produces a very large effective resistance value (the resister value times 512, for example). If the clock frequency used to switch the resistor is close to the frequency of the signal that is sampled, aliasing occurs. In a worst case situation, a DC component of the input signal is generated which results in a DC offset to the amplifier.

Furthermore, the use high clock frequencies (on the order of a gigahertz) is impractical. In addition, charge injection occurs in the switched resistor, and at the higher clock rates so much charge injection occurs that the high resistance effect is lost.

In view of the above, conventional switched resistors have used a fixed switching frequency. Switched resistors using fixed frequency switching require the input signal frequency to be much less than the switch frequency to avoid modulation. This imposes a limit on the input signal bandwidth or the maximum value of the equivalent resistance. If the input signal frequency happens to be in the neighborhood of or greater than the switch frequency, modulation occurs. The magnitude of the modulation may be as big as the amplitude of the input. This means the output signal has an amplitude error of as much as 100%.

The presence of modulation thus imposes a limit on the switch frequency and input signal frequency. Ultimately, this sets a limit on the attainable equivalent resistance. The equivalent resistance is inversely proportional to the duty cycle of the switch. To obtain the highest equivalent resistance, it is desirable to make the switch on-time as short as possible and the switch frequency as low as possible. The on-time is limited by the offset voltage caused by charge injection of the switch. The period is limited by the input frequency to avoid modulation. Thus high resistance and high input signal frequency are incompatible.

In view of the above, it is an objective of the present invention to provide for a switched resistor that emulates a high resistance and that overcomes the problems outlined above.

SUMMARY OF THE INVENTION

In order to provide for the above and other objectives, the present invention is a pseudo-random switched resistor that emulates a predetermined high resistance value in a semiconductor device. The present pseudo-random switched resistor comprises a relatively low value resistor in series with a pseudo-random frequency (low duty cycle) switch, such as is provided by a metal oxide semiconductor (MOS) switch controlled by a pseudo-random pulse generator.

The pseudo-random duty cycle switched resistor is formed using a relatively low value resistor in series with the switch, for example. The switch is controlled by the pseudo-random pulse generator. The pseudo-random pulse generator is comprised a maximum code length linear feedback shift register, a binary counter, an equivalence circuit and a D-type flip-flop. The pseudo-random pulse generator controls the on-time of the switch in a manner that eliminates aliasing and provides for a high resistance, low capacitance resistor that operates at high frequency.

More particularly, the pseudo-random switched resistor comprises the relatively low value resistor, a switch coupled to the resistor, and a pseudo-random pulse generator coupled to the switch. The pseudo-random pulse generator controls the on-time of the switch to emulate the relatively high input impedance. The random pulse generator comprises a plurality of cascaded circuits that are coupled to a flip flop. The plurality of cascaded circuits each comprise a shift register for receiving clock signals and for generating a sequence of $(2^N-1)$ pseudo-random numbers and a terminal count pulse at the end of every sequence, an N-bit binary counter for receiving the terminal count pulse which clocks it, and an equivalence circuit for comparing the outputs of the shift register and the binary counter and for generating an output signal when there is a match. The flip-flop generates a pulse to close the switch whenever there is a match between the output of the shift register and the binary counter as determined by the equivalence circuit.

By using a pseudo-random duty cycle switch as part of the switched resistor, the output amplitude error caused by the modulation between the input signal and the switching signal is greatly reduced. By using a pseudo-random frequency switch, the switched resistor can achieve high equivalent resistance and impose no limit on the input signal frequency.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 is a diagram of a pseudo-random switched resistor in accordance with the principles of the present invention;

FIG. 2 shows signals present in the pseudo-random switched resistor of FIG. 1;

FIG. 3 is a block diagram illustrating details of a random pulse generator used in the pseudo-random switched resistor of FIG. 1;

DETAILED DESCRIPTION

Figure 4:
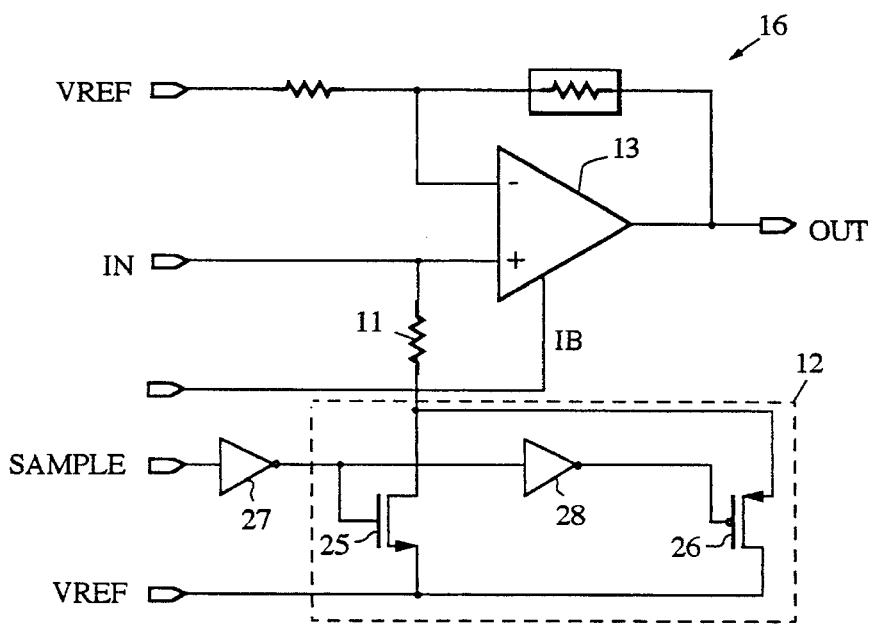
FIG. 4 illustrates details of the pseudo-random pulse generator of FIG. 3.

Referring to the drawing figures, FIG. 1 illustrates a diagram of a pseudo-random switched resistor 10 in accordance with the principles of the present invention. The pseudo-random switched resistor 10 is a pseudo-random duty cycle switched resistor 10. The pseudo-random duty cycle switched resistor 10 is formed using a relatively low value resistor 11 (compared to the value that is desired) in series with a semiconductor switch 12, such as a MOS switch 12, for example. The MOS switch 12 is controlled by a pseudo-random pulse generator 14 that is driven by a clock 15. The pseudo-random switched resistor 10 may be used to provide a relatively high input impedance (1 gigohm, for example) at an input to an amplifier 13, for example, although it is not limited to this purpose. Typically, the amplifier has a feedback loop 16 that is used to set its gain.

FIG. 2 shows signals present in the pseudo-random switched resistor 10 of FIG. 1. The graph identified as $A_R$ shows a pseudo-random control signal that controls the on-time of the MOS switch 12, while the lowest graph represents an input signal (IN) applied to the amplifier 13. This figure also illustrates the problem that occurs with conventional switched resistors, illustrated by the graph identified as Ap which shows a conventional periodic control signal. That is, if the clock frequency used to switch the resistor is close to the frequency of the signal that is sampled, such as is illustrated by the signal Ap, aliasing occurs. In a worst case situation, a DC component of the input signal is generated that results in a DC offset to the amplifier. This, however, does not occur in the present invention which provides the pseudo-random control signal $A_R$.

FIG. 3 is a block diagram illustrating details of the random pulse generator 14 used in the pseudo-random switched resistor 10 of FIG. 1. The pseudo-random pulse generator 14 is comprised a plurality of cascaded circuits 14a (FIG. 5) that comprise a maximum code length linear feedback shift register (LFSR) 21, an N-bit binary counter 23, and an equivalence circuit 22, interconnected as shown in FIG. 3. The output of the last cascaded circuit is coupled to a D-type flip-flop 24 that produces a control signal (A), comprising an output signal (or pulse), that controls the switching of the MOS switch 12 that is coupled to the resistor 11. This is shown and described in greater detail with reference to FIG. 5.

Using a free running clock signal derived from the clock 15 as an input, the N-bit linear feedback shift register 21 generates a sequence of ($2^N-1$) pseudo-random numbers and a terminal count (TC) pulse at the end of every sequence. The terminal count (TC) pulse is coupled through the N-bit binary counter 23 whose output, along with the sequence of ($2^N-1$) pseudo-random numbers generated by the shift register 21, are coupled to the equivalence circuit 22 of a particular stage. The terminal count pulse (TC) clocks the N-bit binary counter 23. The number of bits output by the pseudo-random pulse generator 14 is a function of the number of stages used thereby. The equivalence circuit 22 compares the output of the linear feedback shift register 21 and the output of the binary counter 23. Whenever there is a match, the D-type flip-flop 24 generates a pulse to close the MOS switch 12.

Referring to FIG. 4, it illustrates details of the MOS switch 12 used in a reduced-to-practice embodiment of the pseudo-random switched resistor 10 of FIG. 1. The construction of the MOS switch 12 is conventional, and is comprised of two MOS field effect transistors 25, 26 connected in parallel whose control inputs are driven by two inverters 27, 28. The sample pulse (A) that is used to switch the MOS switch 12 is derived from the output of the D-type flip-flop 24 of the random pulse generator 14. The average duty cycle of the MOS switch 12 is given by: Switch ON duty cycle=$1/(2^{N-1})$. The equivalent resistance is given by: $R_{eq}=(2^{N-1})*R$. The resistor 11 is coupled between the switch 12 and a positive input of the amplifier 13.

Figure 5:
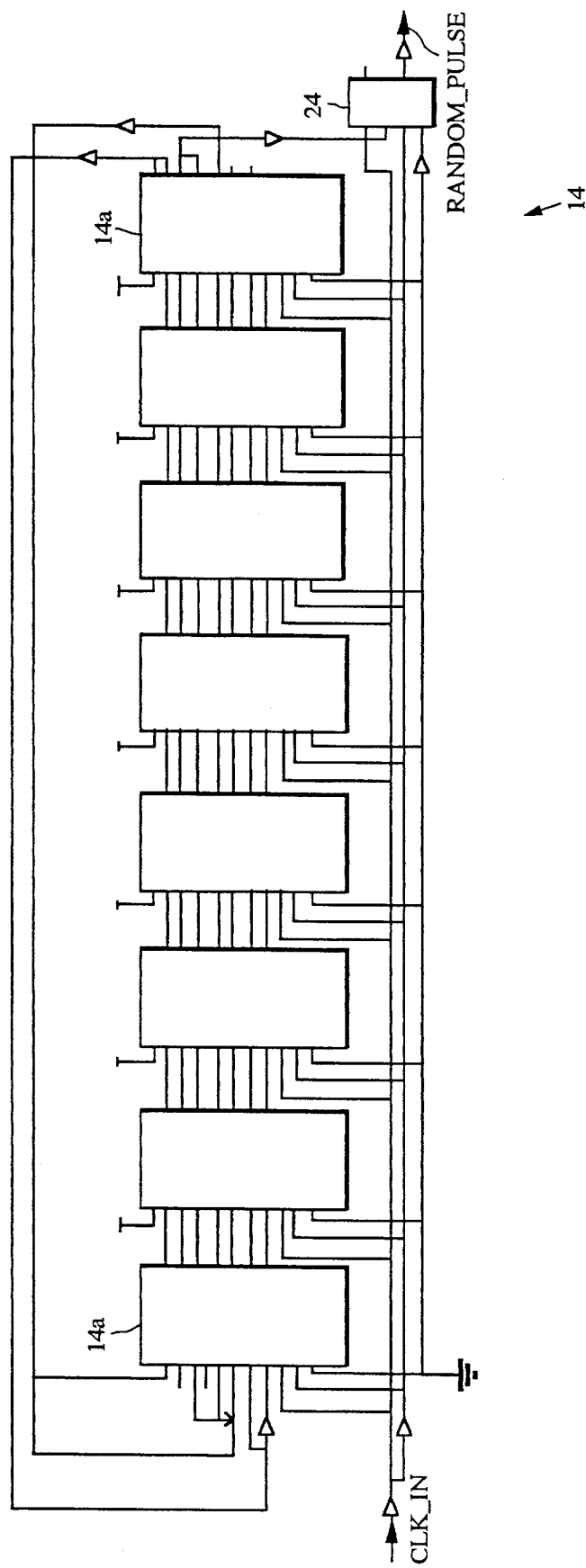
FIG. 5 illustrates details of the MOS switch used in the pseudo-random switched resistor of FIG. 1.

FIG. 5 illustrates details of the pseudo-random pulse generator 14 used in the pseudo-random switched resistor 10 of FIG. 1. Each of the cascaded circuits 14a shown in FIG. 4 provides one bit of the output signal provided by the pseudo-random pulse generator 14. The details of construction of this circuit will not be described in detail since its construction is considered routine for those skilled in the art.

Figure 6:
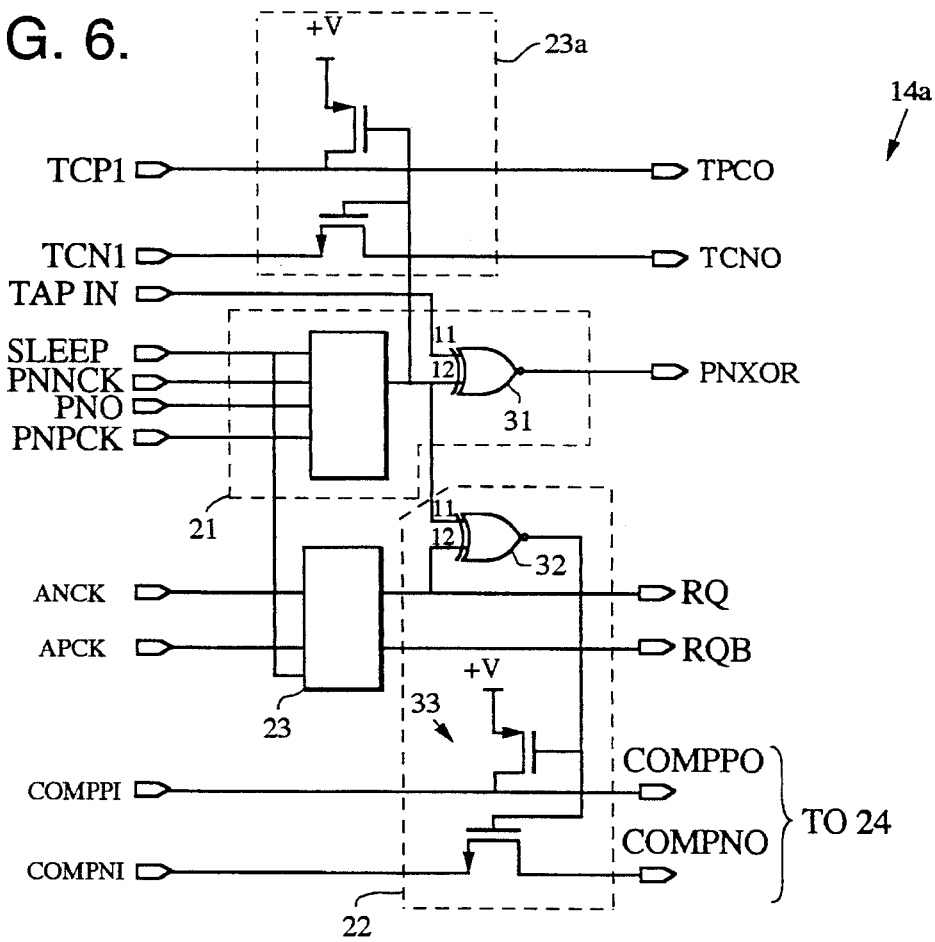
FIG. 6 illustrates details of circuits employed in the pseudo-random pulse generator of FIG. 3.

FIG. 6 illustrates details of circuits 14a employed in the pseudo-random pulse generator 14 of FIG. 3. The pseudo-random pulse generator 14 is constructed as shown in FIG. 6 but will not be described in detail, since it is considered routine in the art. However, the N-bit binary counter 23 includes two MOS field effect transistors 23a as part of the circuit, which process input signals that are coupled through each of the circuits 14a to provide inputs to the flip-flop 24. The shift register 21 has its output coupled through an exclusive-OR gate 31. The equivalence circuit 22 includes an exclusive-OR gate 32 and two MOS field effect transistors 33.

The pseudo-random switched resistor 10 has been implemented in a circuit developed for use is in disk drives, and the like. However, the present pseudo-random switched resistor 10 may also be used in other applications, including automotive applications such as crash sensors (accelerometer) for air bag systems, and the like.

Thus there has been described a new and improved pseudo-random switched resistor that emulates a high resistance. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A pseudo-random switched resistor for emulating a relatively high input impedance, said switched resistor comprising:

a relatively low value resistor;

a semiconductor switch coupled to the resistor; and a relatively low duty cycle pseudo-random pulse generator coupled to the semiconductor switch for controlling the on time of the semiconductor switch to emulate a relatively high input impedance.

2. The pseudo-random switched resistor of claim 1 wherein the random pulse generator comprises:

a plurality of cascaded circuits that each comprise:
   a shift register having an input coupled to a clock for receiving a clock signal therefrom and for generating a sequence of pseudo-random numbers and a terminal count pulse at the end of every sequence;
   an N-bit binary counter coupled to the shift register for receiving the terminal count pulse which clocks it; and
   an equivalence circuit coupled to the shift register and the N-bit binary counter for comparing the outputs of the shift register and the binary counter and for generating an output signal when there is a match; and a flip-flop coupled to the equivalence circuit for generating a pulse to close the semiconductor switch whenever there is a match between the outputs of the shift register and the binary counter as determined by the equivalence circuit.

3. The pseudo-random switched resistor of claim 1 wherein the semiconductor switch comprises a MOS switch.

4. The pseudo-random switched resistor of claim 3 wherein the random pulse generator comprises:

a plurality of cascaded circuits that each comprise:

a shift register having an input coupled to a clock for receiving a clock signal therefrom and for generating a sequence of pseudo-random numbers and a terminal count pulse at the end of every sequence;

an N-bit binary counter coupled to the shift register for receiving the terminal count pulse which clocks it; and an equivalence circuit coupled to the shift register and the N-bit binary counter for comparing the outputs of the shift register and the binary counter and for generating an output signal when there is a match; and a flip-flop coupled to the equivalence circuit for generating a pulse to close the MOS switch whenever there is a match between the outputs of the shift register and the binary counter as determined by the equivalence circuit.

5. A pseudo-random switched resistor for emulating a relatively high input impedance presented to an amplifier, said switched resistor comprising:

a relatively low value resistor;

a semiconductor switch coupled in series between the resistor and an input of the amplifier; and a pseudo-random pulse generator coupled to the semiconductor switch for controlling the on time of the semiconductor switch to emulate a relatively high input impedance presented to the amplifier.

6. The pseudo-random switched resistor of claim 5 wherein the random pulse generator comprises:

a plurality of cascaded circuits that each comprise:

a shift register having an input coupled to a clock for receiving a clock signal therefrom and for generating a sequence of pseudo-random numbers and a terminal count pulse at the end of every sequence;

an N-bit binary counter coupled to the shift register for receiving the terminal count pulse which clocks it; and an equivalence circuit coupled to the shift register and the N-bit binary counter for comparing the outputs of the shift register and the binary counter and for generating an output signal when there is a match; and a flip-flop coupled to the equivalence circuit for generating a pulse to close the semiconductor switch whenever there is a match between the outputs of the shift register and the binary counter as determined by the equivalence circuit.

7. The pseudo-random switched resistor of claim 5 wherein the semiconductor switch comprises a MOS switch.

8. The pseudo-random switched resistor of claim 7 wherein the random pulse generator comprises:

a plurality of cascaded circuits that each comprise:

a shift register having an input coupled to a clock for receiving a clock signal therefrom and for generating a sequence of pseudo-random numbers and a terminal count pulse at the end of every sequence;

an N-bit binary counter coupled to the shift register for receiving the terminal count pulse which clocks it; and an equivalence circuit coupled to the shift register and the N-bit binary counter for comparing the outputs of the shift register and the binary counter and for generating an output signal when there is a match; and a flip-flop coupled to the equivalence circuit for generating a pulse to close the MOS switch whenever there is a match between the outputs of the shift register and the binary counter as determined by the equivalence circuit.

\* \* \* \* \*